United States Patent
Sato

(10) Patent No.: US 8,625,072 B2
(45) Date of Patent: Jan. 7, 2014

(54) EXPOSURE APPARATUS, EXPOSURE METHOD, AND METHOD OF MANUFACTURING DEVICE

(75) Inventor: Takanori Sato, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 311 days.

(21) Appl. No.: 13/099,686

(22) Filed: May 3, 2011

(65) Prior Publication Data

US 2011/0273686 A1 Nov. 10, 2011

(30) Foreign Application Priority Data

May 7, 2010 (JP) .................................. 2010-107716

(51) Int. Cl.
*G03B 27/42* (2006.01)
*G03B 27/52* (2006.01)

(52) U.S. Cl.
USPC .............................................. 355/53; 355/55

(58) Field of Classification Search
USPC .................... 355/52, 53, 55, 67, 77; 250/548; 356/399–401
See application file for complete search history.

(56) References Cited

U.S. PATENT DOCUMENTS

| 5,448,332 A * | 9/1995 | Sakakibara et al. ............ 355/53 |
| 6,090,510 A * | 7/2000 | Tokuda ............................ 430/30 |
| 6,608,681 B2 * | 8/2003 | Tanaka et al. ................. 356/400 |
| 7,209,215 B2 * | 4/2007 | Akamatsu ....................... 355/55 |

FOREIGN PATENT DOCUMENTS

| JP | 9-045608 A | 2/1997 |
| JP | 10-064980 A | 3/1998 |
| JP | 11-191522 A | 7/1999 |

* cited by examiner

*Primary Examiner* — Hung Henry Nguyen
(74) *Attorney, Agent, or Firm* — Rossi, Kimms & McDowell LLP

(57) ABSTRACT

A scanning exposure apparatus measures levels of a substrate at a predetermined position on the substrate at a first measurement point during the acceleration period and a second measurement point during the constant velocity period, obtains a correction value for a measurement error due to factors associated with acceleration based on the measurement results, corrects the measured level using the obtained correction value and exposes the substrate so that the level at a given position on the substrate becomes equal to the corrected level, when the substrate is exposed at the given position after the level is measured while the stage accelerates, and exposes the substrate so that the level at a given position on the substrate becomes equal to the measured level measured, when the substrate is exposed after the level of the substrate at the given position is measured while the stage moves at a constant velocity.

6 Claims, 7 Drawing Sheets

EXPOSURE APPARATUS, EXPOSURE METHOD, AND METHOD OF MANUFACTURING DEVICE

BACKGROUND OF THE INVENTION

1. Field of the Invention

The present invention relates to an exposure apparatus, an exposure method, and a method of manufacturing a device.

2. Description of the Related Art

To improve productivity, a conventional exposure apparatus measures the surface position of a wafer, mounted on a stage, while the stage moves. When the surface position of the wafer is measured while the stage moves and especially while the stage accelerates or decelerates, deformation of the main structure of the apparatus occurs, thus generating a measurement error in the measurement result of the surface position. An exposure apparatus disclosed in Japanese Patent Laid-Open No. 11-191522 obtains a correction value to correct for errors in measurement, prior to exposure. This correction value is calculated based on a pitching component of the stage orientation. The exposure apparatus corrects the measurement result of the surface position, measured while the stage moves, using the correction value, and exposes the wafer in accordance with the corrected surface position.

However, Japanese Patent Laid-Open No. 11-191522 discloses no technique for measuring the level of a substrate while the stage accelerates, positioning the stage which is moving at a constant velocity, based on the measured level, and exposing the substrate. To meet the recent demand for a further improvement in productivity, the acceleration value or the deceleration value of the stage is likely to increase so as to quickly position the stage. As a result, not only deformation of the main structure of the apparatus but also that of the stage itself and even that of a measurement device mounted on the stage, such as a reference mirror for a laser interferometer, occur, so the measurement result obtained by the measurement device includes a measurement error due to factors associated with acceleration of the stage.

SUMMARY OF THE INVENTION

The present invention provides an exposure apparatus which measures the level of a substrate while a stage accelerates, but nonetheless can precisely measure the level of the substrate held on the stage which is moving at a constant velocity, based on the measured level.

According to one aspect of the present invention, there is provided an exposure apparatus which projects a pattern of a reticle onto a substrate via a projection optical system using slit-shaped light while scanning the reticle and the substrate, thereby exposing the substrate, the apparatus comprising: a stage which holds the substrate; a positioning mechanism which positions the stage in a first direction to scan the substrate and a second direction parallel to an optical axis of the projection optical system; a measurement device which measures a level of the substrate that is a position of the substrate in the second direction at a plurality of measurement points located with spacings therebetween in the first direction; and a controller, wherein the plurality of measurement points include a first measurement point at which the level of the substrate can be measured earliest, and a second measurement point within a region in which the slit-shaped light is incident on the substrate, the exposure apparatus is configured to measure the level of the substrate at the first measurement point using the measurement device, and expose the substrate while positioning the stage in the second direction using the positioning mechanism based on the level measured at the first measurement point, and the controller causes, before the substrate is exposed, the measurement device to measure the level of the substrate at a predetermined position on the substrate at the first measurement point while the stage accelerates, and measure the level of the substrate at the predetermined position at the second measurement point while the stage moves at a constant velocity, calculates a difference between the measurement results of the level of the substrate at the predetermined position, which are obtained at the first measurement point and the second measurement point, respectively, to obtain the calculated difference as a correction value for a measurement error due to factors associated with acceleration of the stage, and corrects the level of the substrate measured at the first measurement point using the obtained correction value and exposes the substrate while controlling the positioning mechanism so that the level of the substrate at a given position on the substrate becomes equal to the level corrected using the correction value, when the substrate is exposed at the given position after the level of the substrate at the given position is measured at the first measurement point while the stage accelerates, and exposes the substrate while controlling the positioning mechanism so that the level of the substrate at a given position on the substrate becomes equal to the level measured at the first measurement point, when the substrate is exposed after the level of the substrate at the given position is measured at the first measurement point while the stage moves at a constant velocity.

Further features of the present invention will become apparent from the following description of exemplary embodiments with reference to the attached drawings.

DESCRIPTION OF THE EMBODIMENTS

First Embodiment

Figure 1:
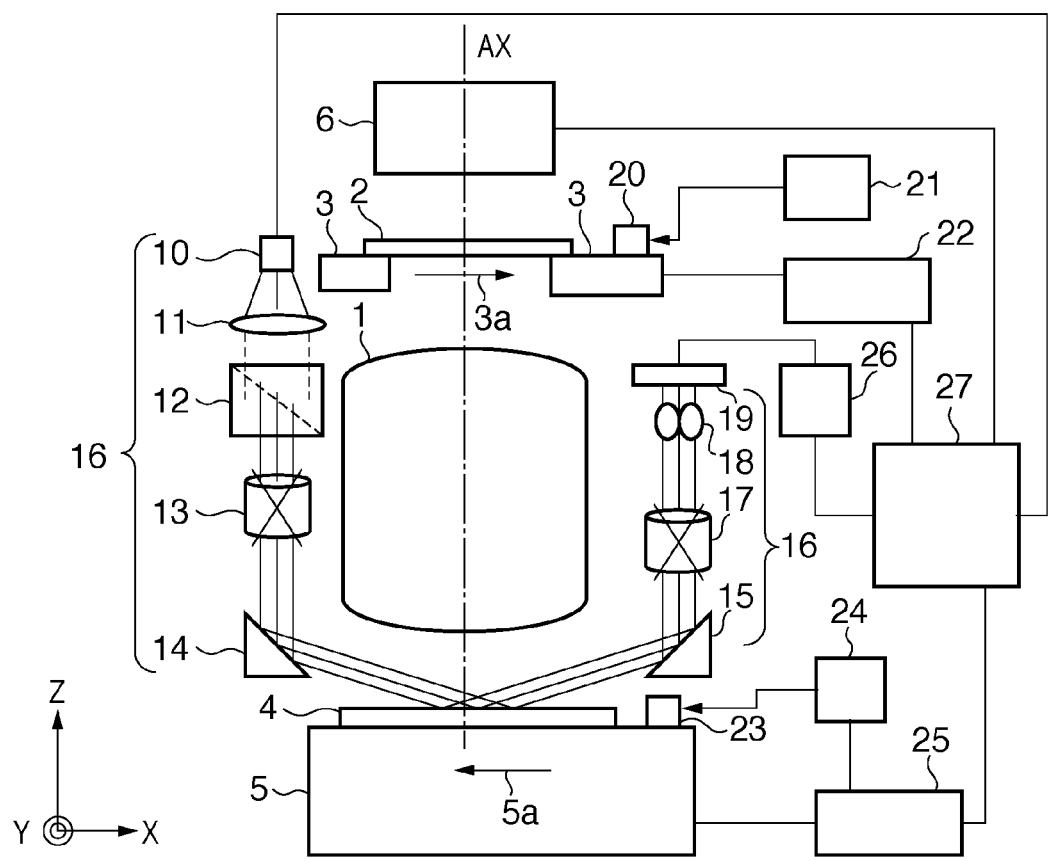
FIG. 1 is a view showing an exposure apparatus according to the first embodiment.

FIG. 1 shows an exposure apparatus according to the first embodiment. The exposure apparatus is a scanning projection exposure apparatus which projects the pattern of a reticle (original) 2 onto a wafer (substrate) 4 via a projection optical system 1 using slit-shaped light while relatively scanning the reticle 2 and the wafer 4 in the X direction (first direction), thereby exposing the wafer 4. The slit shape which determines an exposure region exposed to the slit-shaped light is a rectangular or arcuated shape. An optical axis AX of the reduction projection optical system 1 runs in the Z direction (second direction), and its image plane is perpendicular to the Z direction parallel to the optical axis AX. The reticle 2 is held on a stage (reticle stage) 3. The pattern of the reticle 2 is reduced to ¼, ½, or ⅕ as the magnification of the reduction projection optical system 1, and projected onto the image plane of the reduction projection optical system 1, thereby forming an image on this image plane. A large number of shot regions with the same pattern structure formed in the preceding exposure process are arrayed on the wafer (substrate) 4 having its surface coated with a resist. A stage (wafer stage) 5 which holds the wafer 4 includes a chuck which chucks and fixes the wafer 4 to the wafer stage 5. That is, the wafer stage 5 serves as a stage which can move while mounting a substrate. The wafer stage 5 also includes X and Y stages which can move horizontally in the X and Y directions, respectively, and can move in the Z direction as well. Moreover, the wafer stage 5 includes a leveling stage which can rotate about the X- and Y-axes, and a rotating stage which can rotate about the Z-axis. In this manner, the wafer stage 5 serves as a six-axis correction system for matching a reticle pattern image with each shot region on the wafer. The positional information of the wafer stage 5 in the X and Y directions is always measured by a bar mirror 23 and interferometer 24 which are fixed on the wafer stage 5.

Figure 2:
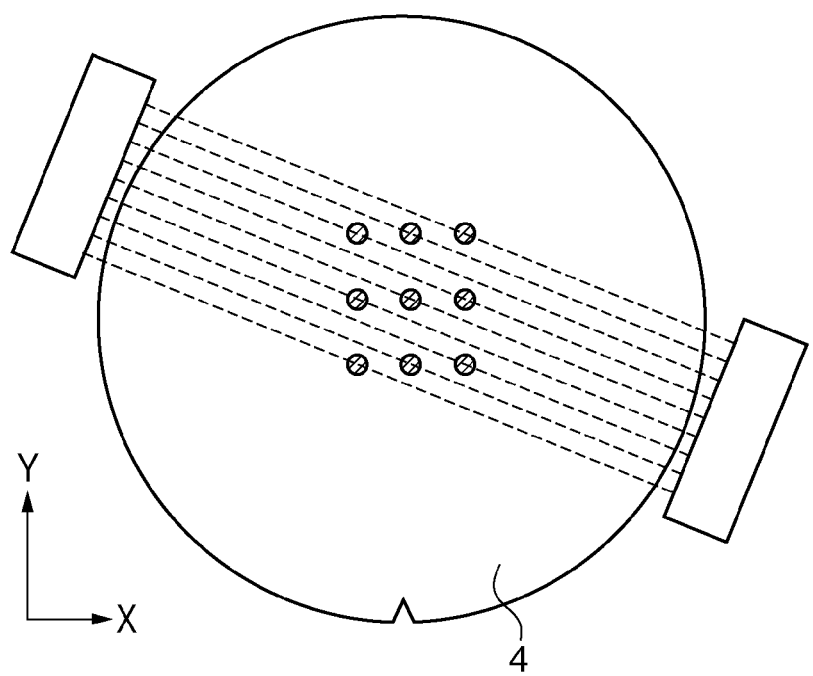
FIG. 2 is a view showing the positional relationship between a wafer and measurement points.

A measurement device 16 provided to measure the surface position and tilt of the wafer 4 includes a light source 10 such as a lamp or a light-emitting diode. A collimator lens 11 receives a light beam from the light source 10, converts it into a collimated light beam with a nearly uniform cross-sectional intensity distribution, and outputs it. A prism-shaped slit member 12 is formed by bonding a pair of prisms together so that their inclined surfaces face each other. A plurality of openings (for example, nine pinholes) are provided in the bonding surface using a light-shielding film made of, for example, chromium. A bilateral telecentric lens 13 guides nine independent light beams having passed through the plurality of pinholes, respectively, in the slit member 12 to nine measurement points, respectively, on the wafer 4 via a mirror 14. At this time, a plane in which the pinholes are formed and that which includes the surface of the wafer 4 are set to satisfy the Scheimpflug condition for the lens 13. In the first embodiment, each light beam emitted by the light source 10 has an incident angle Φ (an angle that this light beam makes with the optical axis) on the wafer 4 is 70° or more. As shown in FIG. 2, the nine light beams having passed through the lens 13 are incident on independent measurement points in the pattern region to form images in it. Also, the nine light beams are incident on the nine measurement points from a direction obtained by rotating the X direction through θ° (for example, 22.5°) within the X-Y plane so that these measurement points are independently observed within the plane of the wafer 4. The light source 10, collimator lens 11, slit member 12, lens 13, and mirror 14 serve as a light projecting optical system which obliquely projects a light beam to a measurement point on the wafer 4.

Each configuration of a bilateral telecentric light receiving optical system which receives the light beams reflected by the wafer 4 will be described next. The light receiving optical system receives, via a mirror 15, the nine light beams reflected by the wafer 4. An aperture stop 17 is provided in the light receiving optical system commonly to the nine measurement points. The aperture stop 17 cuts high-order diffracted light (noise light) generated by the circuit pattern present on the wafer 4. The light beams having passed through the bilateral telecentric light receiving optical system have parallel optical axes. Nine individual correction lenses in correction optical systems 18 form images of the nine light beams again on the measurement surface of photoelectric conversion elements 19 so that they become spotlight beams with the same size. Also, the light receiving optical system performs angle error correction so that each measurement point on the wafer 4 becomes conjugate to the measurement surface of the photoelectric conversion elements 19. Therefore, the position of a pinhole image does not change on the measurement surface due to a local tilt of each measurement point, but changes on the measurement surface in response to a change in level of each measurement point in the direction of the optical axis AX. Although the photoelectric conversion elements 19 include, for example, nine one-dimensional CCD line sensors, the same effect can also be attained when a plurality of two-dimensional position measurement elements are arranged. The light projecting optical system including the members 10 to 14 and the light receiving optical system including the members 15 to 19 serve as the measurement device 16 which measures the level of the wafer 4 at a plurality of measurement points which are aligned with spacings between them in the X direction (first direction). A measurement device controller 26 controls the measurement device 16.

As shown in FIG. 1, the reticle 2 is chucked and fixed to the reticle stage 3. The reticle stage 3 scans at a constant velocity in the X direction (an arrow 3a) within a plane perpendicular to the optical axis AX of the projection optical system 1. At this time, the reticle stage 3 undergoes correction driving in the Y direction so as to scan while always maintaining a target position. The positional information of the reticle stage 3 in the X and Y directions is always measured by a bar mirror 20 and interferometer 21 which are fixed on the reticle stage 3 shown in FIG. 1. An illumination optical system 6 includes a light source which generates pulsed light, such as an excimer laser. The illumination optical system 6 also includes members (not shown) such as a beam shaping optical system, optical integrator, collimator, and mirror, and is formed from a material which efficiently transmits or reflects pulsed light in the far-ultraviolet range. The beam shaping optical system shapes the cross-sectional shape (including the size) of the incident beam into a desired shape. The optical integrator uniforms the distribution characteristics of a light beam to illuminate the reticle 2 with a uniform illuminance. A masking blade (not shown) within the illumination optical system 6 sets a rectangular illumination region in correspondence with the chip size. The pattern on the reticle 2 partially illuminated in the illumination region is projected onto the wafer 4 via the projection optical system 1.

To form a slit image of the reticle 2 in a predetermined region on the wafer 4, a main controller 27 controls the following operation. That is, the main controller 27 adjusts the position within the X-Y plane (the X and Y positions and the rotation e about the Z-axis) and that in the Z direction (the rotations θ and β about the X- and Y-axes, respectively, and the level Z on the Z-axis). Also, the main controller 27 scans the reticle stage 3 and the wafer stage 5 in synchronism with the projection optical system 1. Moreover, the main controller 27 performs scanning exposure, in which the pattern on the reticle 2 is projected and transferred by exposure onto the wafer 4 via the projection optical system 1. In scanning the reticle stage 3 in the direction indicated by the arrow 3a shown in FIG. 1, the main controller 27 scans the wafer stage 5 at a velocity corrected by an amount equal to the reduction magnification of the projection optical system 1 in the direction indicated by an arrow 5a shown in FIG. 1. The scanning velocity of the reticle stage 3 is determined so as to achieve a high productivity, based on the width of the masking blade in the scanning direction within the illumination optical system 6, and the sensitivity of a resist applied on the surface of the wafer 4. The main controller 27 calculates control data based on the position data obtained by the interferometer 21 for the reticle stage 3 and the interferometer 24 for the wafer stage 5, and that of the wafer 4 obtained by an alignment microscope (not shown). Based on the control data, the main controller 27 controls a reticle stage controller 22 and a wafer stage controller 25 to align the pattern on the reticle 2 within the X-Y plane. The wafer stage controller 25 serves as a positioning mechanism which positions the wafer stage 5 in the X direction (first direction) and the Z direction (second direction). The main controller 27, reticle stage controller 22, wafer stage controller 25, and measurement device controller 26 serve as a controller.

Figure 3:
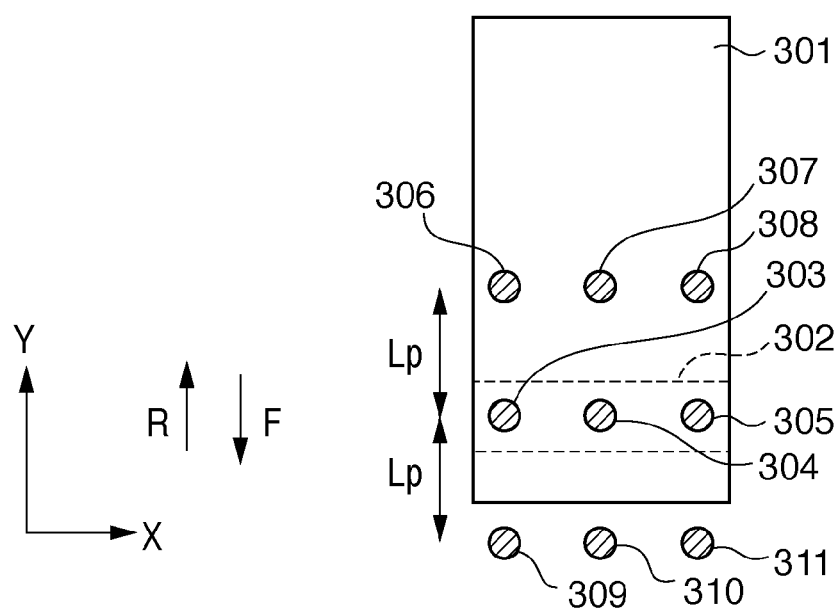
FIG. 3 is a view showing the positional relationship between measurement points and an exposure slit.

FIG. 3 shows the relationship between nine surface position measurement points formed in a shot region 301 on the wafer 4 by the photoelectric conversion elements 19, and an exposure slit 302. The exposure slit 302 is a rectangular exposure region surrounded by a broken line in FIG. 3. Measurement points 303 to 305 are surface position measurement points (second measurement points) within a region which is formed within the exposure slit 302 and in which slit-shaped light is incident on the wafer 4. Measurement points 306 to 311 are measurement points (first measurement points) which are spaced apart from the exposure slit 302 at a distance Lp and at which the level of the wafer 4 can be measured earliest. Of the measurement points 306 to 311, the measurement points used are switched in accordance with the moving direction of the wafer stage 5. For example, in scanning exposure in a direction F, the surface position of the shot region 301 is measured at the measurement points 306 to 308 prior to measurement at the measurement points 303 to 305, respectively, within the exposure slit 302. Before the region to be exposed reaches inside the exposure slit 302, the main controller 27 drives the wafer stage 5 to an optimum exposure image plane position based on the measurement results obtained at the measurement points 306 to 308. On the other hand, in scanning exposure in a direction R, the surface position of the shot region 301 is measured at the measurement points 309 to 311 prior to measurement at the measurement points 303 to 305, respectively, within the exposure slit 302. Before the region to be exposed reaches inside the exposure slit 302, the main controller 27 drives the wafer stage 5 to an optimum exposure image plane position based on the measurement results obtained at the measurement points 309 to 311. The exposure apparatus is configured to perform exposure processing while positioning the position of the wafer 4 in the Z direction at the exposure position based on the level of the wafer 4 measured at the measurement points 306 to 308 or 309 to 311 at which the level of the wafer 4 can be measured earliest.

Figure 4A:
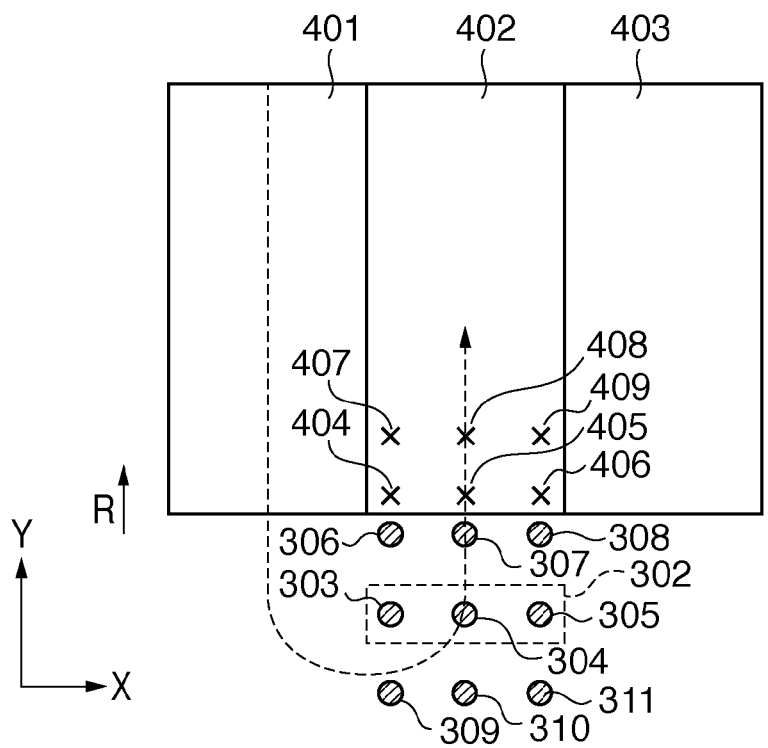
FIGS. 4A and 4B are views showing a measurement method in scanning exposure.
Figure 4B:
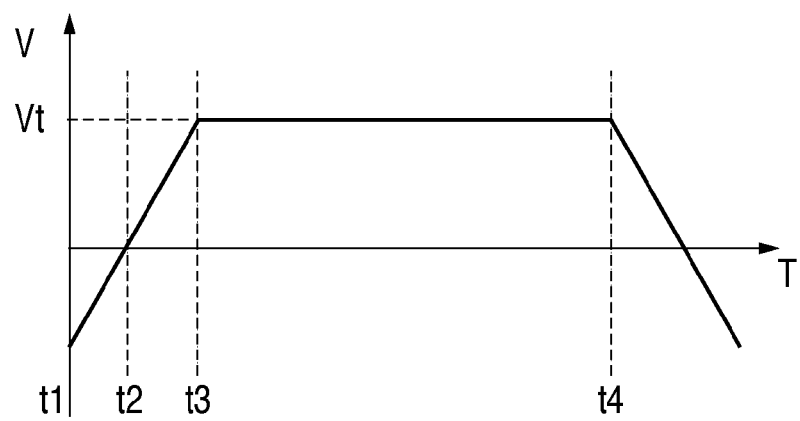

A method of measuring the surface position in scanning exposure will be described with reference to FIGS. 4A and 4B. FIG. 4A is a view showing shot regions, surface position measurement points, and a driving track of the wafer stage 5. A shot region 401 is an already exposed shot region, a shot region 402 is a currently exposed shot region, and a shot region 403 is a shot region to be exposed next to the shot region 402. An arrowed broken line in FIG. 4A indicates a driving track of the wafer stage 5. FIG. 4B is a graph showing the relationship between time and the velocity of the wafer stage 5 upon driving it along the track shown in FIG. 4A. After exposure of the shot region 401 is completed, the wafer stage 5 is driven in the X direction with deceleration, thereby moving to the shot region 402 to be exposed next. The deceleration period corresponds to the interval from time t1 to time t2 in FIG. 4B. Subsequently, when an acceleration start point (not shown) is reached, the main controller 27 accelerates the wafer stage 5 in the direction R. The acceleration period corresponds to the interval from time t2 to time t3 in FIG. 4B. The velocity of the wafer stage 5 desirably reaches a target velocity at least until the exposure slit 302 arrives at the shot region 402. After the velocity of the wafer stage 5 reaches the target velocity, the wafer stage 5 continues scanning at a constant velocity until it leaves the shot region 402. The constant velocity period corresponds to the interval from time t3 to time t4 in FIG. 4B. At this time, the main controller 27 performs exposure processing while sequentially performing surface position measurement of the shot region 402 and driving to an optimum exposure image plane position. After the exposure slit 302 leaves the shot region 402, the main controller 27 decelerates the wafer stage 5 in preparation for exposure of the shot region 403, drives it in the X direction, and accelerates it. The deceleration period corresponds to the interval after time t4.

Figure 5:
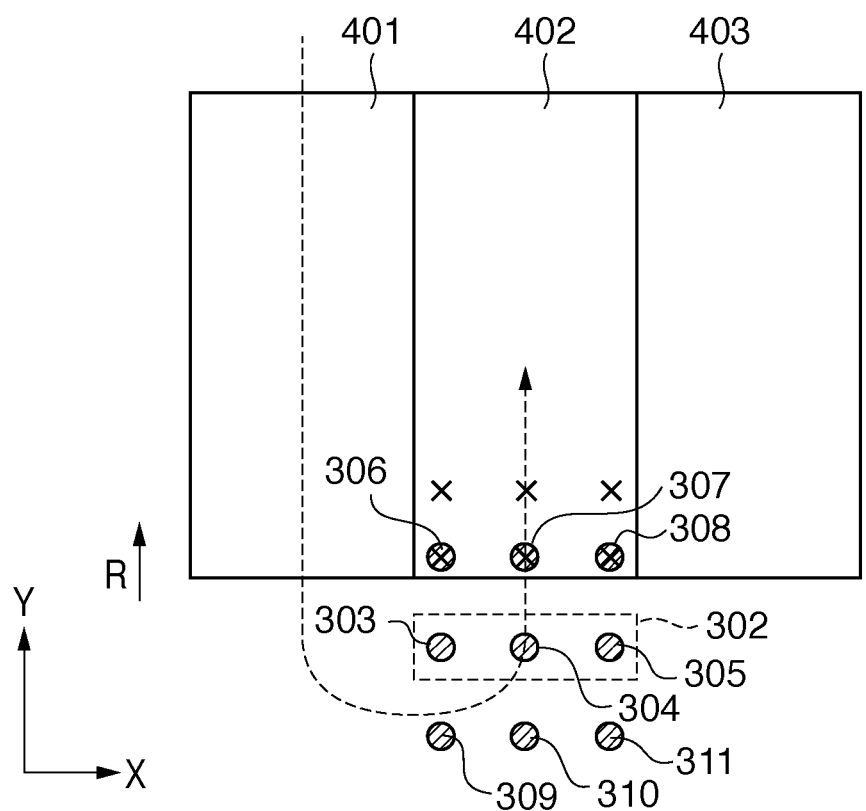
FIG. 5 is a view showing the measurement method in scanning exposure.

Surface positions 404 to 409 shown in FIG. 4A exemplify measurement positions in the shot region 402. Although a plurality of measurement positions are present in the Y direction in the shot region 402 to measure the surface position of the entire shot region 402, FIG. 4A shows only the surface positions 404 to 409 for the sake of simplicity. A case in which the measurement device 16 measures the surface positions 404 to 406 at the surface position measurement points 306 to 308, respectively, will be considered first. This measurement will be explained in detail with reference to FIG. 5. As described earlier, after exposure of the shot region 401 is completed, the main controller 27 decelerates the wafer stage 5 in preparation for exposure of the shot region 402, drives it in the X direction, and accelerates it. When the surface position measurement points 306 to 308 reach the surface positions 404 to 406, respectively, the wafer stage 5 has a velocity defined in the interval between times t2 and t3 in FIG. 4B, and is therefore accelerating at this time. Upon acceleration of the wafer stage 5, deformations of the main structure of the exposure apparatus and the wafer stage 5 itself occur. The surface positions 404 to 406 which are measured at the surface position measurement points 306 to 308, respectively, by the measurement device 16 include measurement errors due to these deformations. If the main controller 27 generates a driving target value for the exposure image plane position based on the surface position measurement results including the measurement errors, defocus occurs, thus leading to resolution insufficiency. The measurement positions 404 to 406 are predetermined positions on the substrate, at which the level of the wafer 4 is measured at first measurement points by the measurement device 16 while the wafer stage 5 accelerates.

A case in which the measurement device 16 measures the surface positions corresponding to the measurement positions 407 to 409 at the surface position measurement points 306 to 308, respectively, will be considered next. When the surface position measurement points 306 to 308 reach the measurement positions 407 to 409, respectively, the wafer stage 5 has a velocity defined in the interval between times t3 and t4 in FIG. 4B, and is therefore moving at a constant velocity at this time. During movement of the wafer stage 5 at a constant velocity, the above-mentioned deformations of the main structure and the wafer stage 5 itself do not occur to the degree that they adversely affect the surface position measurement results. Note that to allow the wafer stage 5 to be moving at a constant velocity when the measurement device 16 measures the surface positions corresponding to the measurement positions 404 to 406 at the surface position measurement points 306 to 308, respectively, it is necessary to adopt one of measures of:

a) keeping the acceleration start point farther away from the shot region, b) shortening the distance Lp between the surface position measurement points 303 to 305 and 306 to 308, respectively, and c) raising the acceleration of the wafer stage 5.

If measure a is chosen, the distance by which the wafer stage 5 moves in the Y direction increases, so the productivity lowers. If measure b is chosen, the time until the region to be exposed reaches inside the exposure slit 302 shortens. Hence, if the wafer 4 has poor evenness, driving to an optimum exposure image plane position cannot be satisfactorily performed, thus leading to defocus. If measure c is chosen, both the size and cost of the exposure apparatus increase. In the above-mentioned manner, to reconcile the productivity and accuracy of the exposure apparatus without driving the cost up, the wafer stage 5 must measure the surface position during acceleration.

Figure 6A:
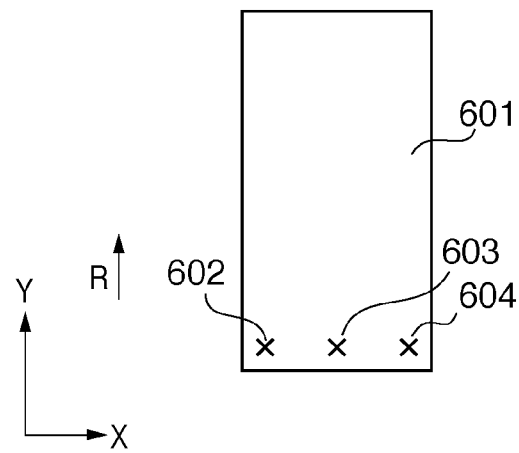
FIGS. 6A, 6B, and 6C are views showing a method of obtaining a measurement error while a stage accelerates.
Figure 6B:
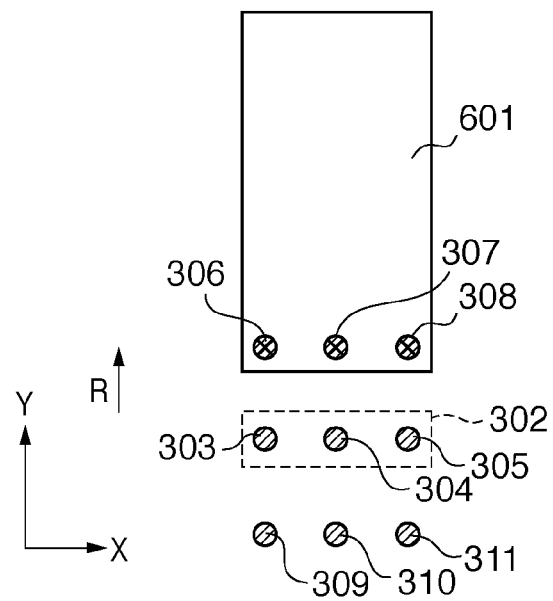
Figure 6C:
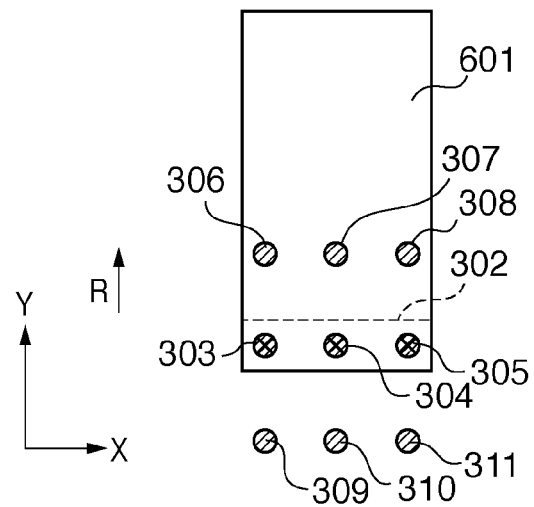

A method of obtaining a measurement error, which is generated upon measuring the surface position while the wafer stage 5 accelerates, prior to exposure will be described next. FIGS. 6A to 6C show the relationships between measurement positions 602 to 604 in a shot region 601, and surface position measurement points. The surface position measurement points 303, 306, and 309 are located at the same X-coordinate position. Also, the measurement points 304, 307, and 310 are located at the same X-coordinate position. Moreover, the measurement points 305, 308, and 311 are located at the same X-coordinate position. Therefore, when each photoelectric conversion element 19 adjusts the measurement timing of the surface position to be measured for scanning in the Y direction, different photoelectric conversion elements 19 can doubly measure the same coordinate position in the shot region. This measurement will be explained in detail with reference to FIGS. 6B and 6C. A case in which the measurement position 602 within the shot region 601 is measured by scanning in a direction R shown in FIG. 6A will be considered. The measurement device 16 measures the measurement position 602 at the surface position measurement point 306 at a timing shown in FIG. 6B. After scanning for a predetermined time, the measurement device 16 measures the measurement position 602 at the surface position measurement point 303 at a timing shown in FIG. 6C. Similarly, the measurement position 603 shown in FIG. 6A is measured at the surface position measurement point 307, and is thereupon measured at the surface position measurement point 304. The measurement position 604 shown in FIG. 6A is measured at the surface position measurement point 308, and is thereupon measured at the surface position measurement point 305. At the moment shown in FIG. 6B, the measurement device 16 measures the measurement positions 602 to 604 at the surface position measurement points 306 to 308, respectively. At this timing, measurement is performed in the interval between times t2 and t3 shown in FIG. 4B, that is, while the wafer stage 5 accelerates. Therefore, the sums of the values of the surface positions corresponding to the measurement positions 602 to 604 and measurement errors due to the above-mentioned deformations are obtained as the measurement results obtained at the surface position measurement points 306 to 308, respectively. At the moment shown in FIG. 6C, the measurement device 16 measures the measurement positions 602 to 604 at the surface position measurement points 303 to 305, respectively. At this timing, measurement is performed in the interval between times t3 and t4 shown in FIG. 4B, that is, while the wafer stage 5 moves at a constant velocity. During movement of the wafer stage 5 at a constant velocity, the above-mentioned deformations do not occur. Thus, the surface positions measured at the surface position measurement points 303 to 305 include no measurement errors, so the surface positions corresponding to the measurement positions 602 to 604, respectively, alone are obtained.

As described earlier, a measurement result α obtained at each of the measurement points 306 to 308 while the wafer stage 5 accelerates, and a measurement result β obtained at each of the measurement points 303 to 305 while it moves at a constant velocity are obtained by measuring the same coordinate position on the wafer 4. Therefore, by calculating the difference between α and β, surface position components of the measurement positions 602 to 604 can be eliminated from the measurement results, thereby extracting only components of the measurement errors. That is, a correction value Comp for a surface position measurement error due to factors associated with acceleration of the wafer stage 5 can be obtained by:

$$\text{Comp} = \alpha - \beta \quad (1)$$

The amount of deformation of, for example, the main structure due to factors associated with acceleration of the wafer stage 5 differs depending on the acceleration of the wafer stage 5. Hence, the correction value Comp may be obtained and held for each acceleration of the wafer stage 5. When the scanning direction in exposure differs, deformations occur in different portions, so the measurement error generated upon surface position measurement changes. Hence, the correction value Comp may be obtained and held for each scanning direction in exposure. The driving track of the wafer stage 5 before and after exposure differs depending on the sizes, positions, and exposure order of shot regions on the wafer 4. The amount of deformation differs depending not only on factors associated with acceleration in the Y direction but also on those associated with driving in the X direction before and after exposure. Hence, the correction value Comp may be obtained and held for each driving track of the wafer stage 5 before and after exposure.

Using the thus obtained correction value Comp, the surface position measured while the wafer stage 5 accelerates is corrected as:

$$F\text{comp} = F\text{org} - \text{Comp} \quad (2)$$

where Fcomp is the surface position measurement value corrected using the correction value Comp, and Forg is the surface position measurement value before correction.

Based on the corrected surface position measurement result Fcomp, the main controller 27 performs exposure processing while performing correction driving of the wafer stage 5 to an optimum exposure image plane position. The surface position measurement result may be corrected using the correction value Comp only for a surface position measurement point measured while the wafer stage 5 accelerates.

Second Embodiment

An example of an exposure method will be described next with reference to FIG. 7. In step 1, a main controller 27 starts control of exposure processing. In step 2, a conveyance hand (not shown) loads a wafer 4 onto a wafer stage 5 to chuck and fix it to a chuck (not shown). In step 3, the main controller 27 performs preliminary measurement and correction for global alignment to be done in step 7. The amount of shift such as a rotation error of the wafer 4 is measured and corrected by a low-powered field alignment microscope (not shown) to fall within the measurement range of a high-powered field alignment microscope (not shown) for use in global alignment. In step 4, the surface positions of a plurality of shot regions (for example, shot regions 801 shown in FIG. 8) on the wafer 4 are measured using a measurement device 16. Based on the measurement results, the main controller 27 calculates and corrects the overall tilt of the wafer 4.

In step 5, the main controller 27 performs preliminary adjustment for measuring the surface position in real time in scanning exposure of step 8. The preliminary adjustment includes, for example, light amount adjustment of a light source 10 in the measurement device 16, as described in Japanese Patent Laid-Open No. 10-64980, and storage of a pattern step on the surface of a shot region on the wafer 4, as described in Japanese Patent Laid-Open No. 9-45608. In step 5 as well, a correction value is obtained for a measurement error generated upon measuring the surface position while the wafer stage 5 accelerates. Surface position measurement for obtaining the correction value is performed while the wafer stage 5 is driven to have the same velocity, acceleration, and track as those set in exposure. After the measurement, a correction value Comp is obtained by equation (1) using a measurement result a of the surface position measured during acceleration and a measurement result β of the surface position measured during movement at a constant velocity, both for the same coordinate position. Correction values Comp may be obtained for all points corresponding to measurement positions in the Y direction within a shot region. Alternatively, only a measurement position while the wafer stage 5 accelerates may be obtained. The correction value Comp may have a value unique to each shot region. Alternatively, the correction value Comp may have a value which depends on the X- and Y-coordinates. Or again, the correction value Comp may hold a value corresponding to a single shot region as a value common to each shot region. Surface position measurement for obtaining the correction value Comp may be performed by measuring all shot regions in the same order as in exposure. Alternatively, a single shot region may be used, as exemplified by a shot region 802 shown in FIG. 8. Or again, a plurality of shot regions may be used and the results may be averaged, as exemplified by the shot regions 801 shown in FIG. 8.

In step 6, correction values for, for example, the tilt and curvature of field of a projection optical system 1 are obtained using a light amount sensor and reference mark (neither is shown) on the wafer stage 5 and a reference plate (not shown) on a reticle stage 3. More specifically, the light amount sensor measures a change in amount of exposure light upon scanning the wafer stage 5 in the X, Y, and Z directions. Based on the change in amount of light obtained by the light amount sensor, the amount of shift of the reference mark with respect to the reference plate is measured, and a correction value is calculated and corrected. In step 7, an alignment mark on the wafer 4 is measured using a high-powered field alignment microscope (not shown) to calculate the amount of shift of the entire wafer and that common to each shot region. To precisely measure the alignment mark, the contrast of the alignment mark must be at a best contrast position. A best contrast position is measured using the measurement device 16 and the alignment microscope. More specifically, while the wafer stage 5 is driven to a predetermined level, and the contrast is measured by the alignment microscope, a process of measuring the surface position by the measurement device 16 is repeated several times. At this time, the contrast measurement result and surface position measurement result corresponding to each level are associated with each other, and stored in the main controller 27. A position at which the contrast is highest is calculated from the plurality of obtained contrast measurement results, and determined as a best contrast position.

In step 8, the measurement device 16 measures, in real time, the surface position in the shot region to be exposed. The surface position measurement result is corrected by the correction value Comp using equation (2). Based on a corrected surface position measurement result Fcomp, the main controller 27 performs exposure processing while performing correction driving of the wafer stage 5 to an optimum exposure image plane position. After exposure processing of all shot regions is completed, the substrate is unloaded from the wafer stage 5 in step 9, and a series of exposure processing ends in step 10.

Figure 7:
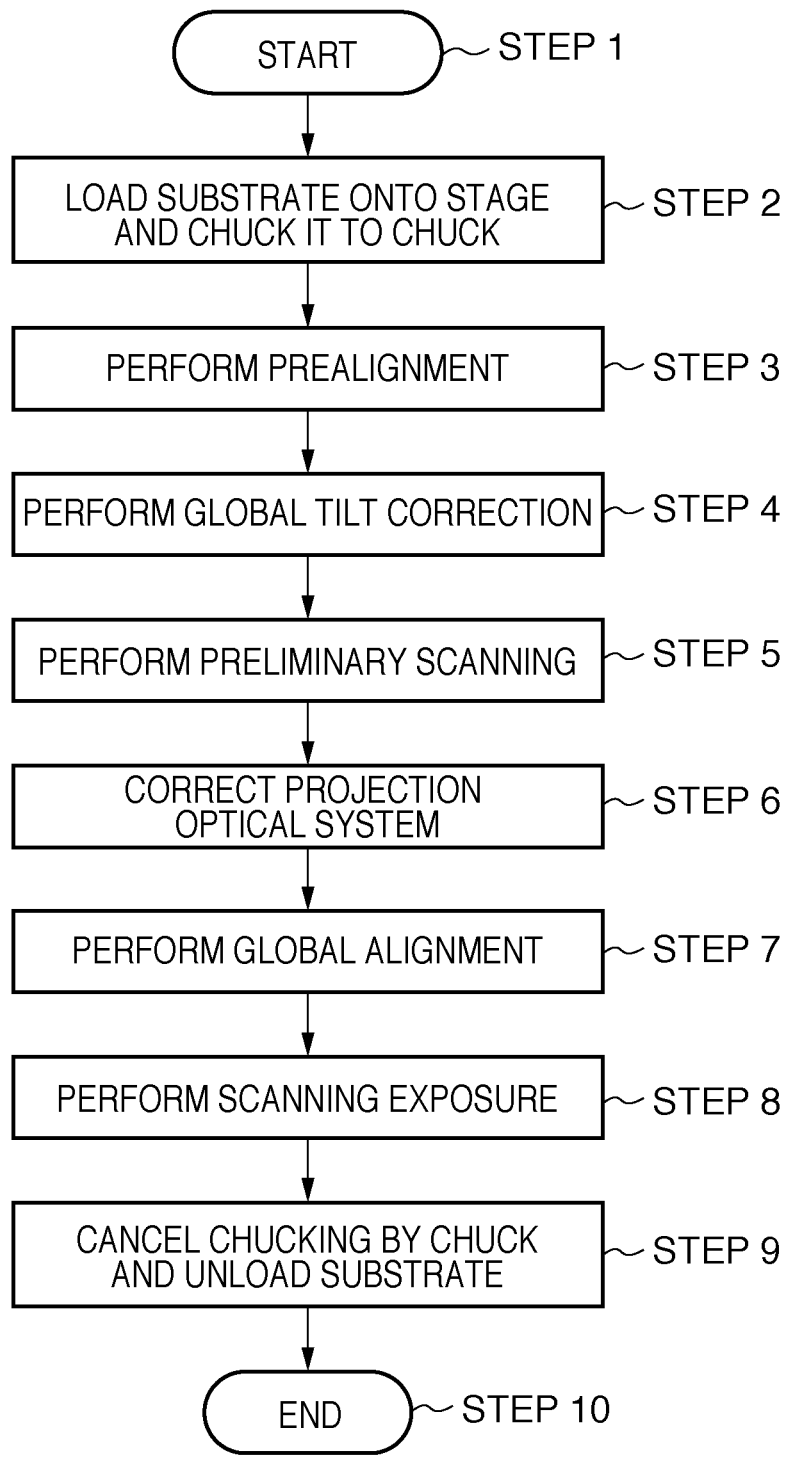
FIG. 7 is a flowchart of an exposure method.
Figure 8:
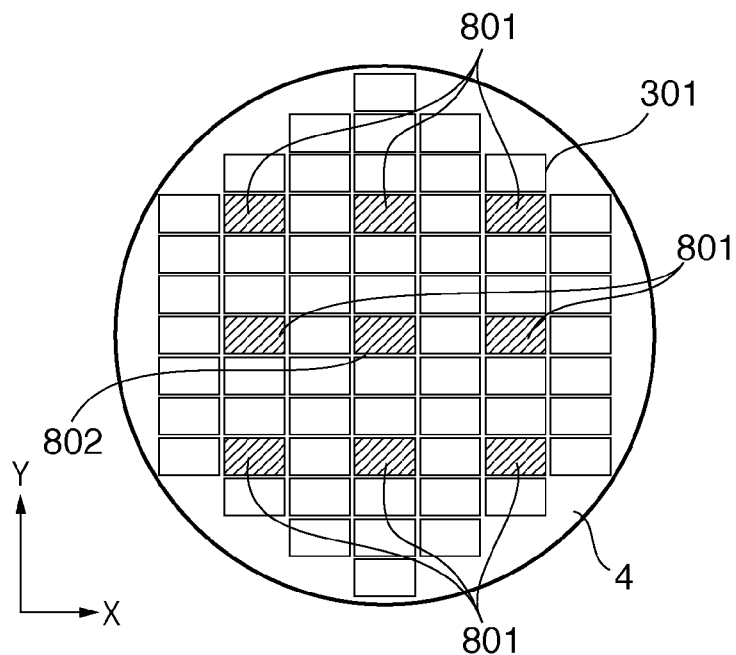
FIG. 8 is a view showing a wafer and shot regions on the wafer.

In the flowchart shown in FIG. 7, the sequence of obtaining the correction value Comp in step 5 is executed for each wafer. To improve the productivity, the sequence of obtaining the correction value Comp may be executed for each set of a plurality of wafers. For example, before exposure processing of a lot, the sequence of obtaining the correction value Comp is executed using at least one wafer belonging to the lot, for example, the first wafer in the lot. Then, for the second and subsequent wafers in the lot, the sequence may be skipped and the correction value Comp obtained for the first wafer in the lot may be used in exposure. Alternatively, a method of executing the sequence only at a specific timing such as assembly, adjustment, or maintenance of the exposure apparatus may be adopted. When the layout conditions such as the sizes, positions, and exposure order of shot regions on the wafer, and the driving conditions such as the velocity and acceleration of the wafer stage are the same, the above-mentioned measurement error is nearly the same. Hence, the correction value Comp obtained in step 5 is held in association with the above-mentioned layout conditions and wafer stage driving conditions. In exposing wafers which are subject to the same conditions, exposure which uses the held correction value Comp may be performed, and the sequence of obtaining the correction value Comp may be skipped.

Third Embodiment

Figure 9:
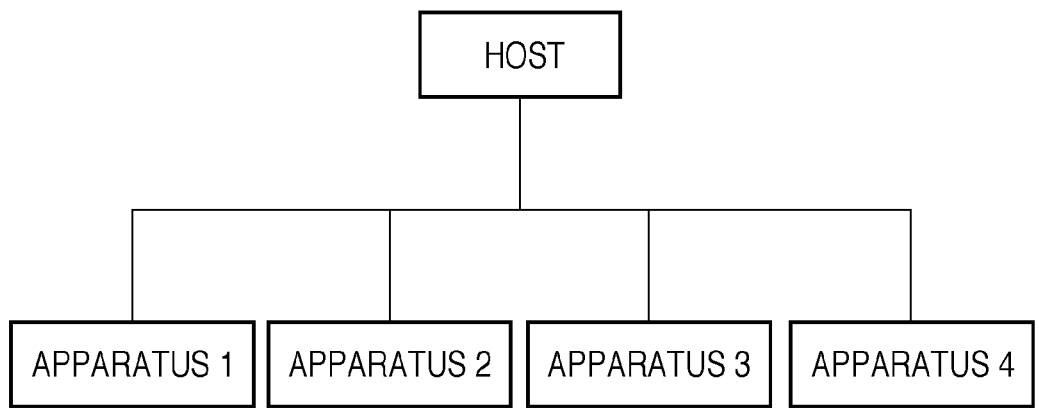
FIG. 9 is a block diagram showing an exposure apparatus according to the third embodiment.

An exposure apparatus according to the third embodiment will be described next with reference to FIG. 9. The exposure apparatus according to the third embodiment is connected to a host computer, as shown in FIG. 9. The host computer is connected to a plurality of (for example, four in FIG. 9) exposure apparatuses 1 to 4. The host computer manages parameters such as the operating condition and offset of the exposure apparatus. The host computer also manages a correction value for a measurement error generated upon measuring the surface position while a wafer stage 5 accelerates, as mentioned earlier. In exposing wafers which are subject to the same conditions as those for another exposure apparatus, the correction value obtained by this exposure apparatus may be used, and the sequence of obtaining the correction value, shown in step 5 of FIG. 7, may be skipped.

Fourth Embodiment

A method of manufacturing a device (for example, a semiconductor device or a liquid crystal display device) will be described next. A semiconductor device is manufactured by a preprocess of forming an integrated circuit on a wafer, and a post-process of completing, as a product, a chip of the integrated circuit formed on the wafer by the preprocess. The preprocess includes a step of exposing a wafer, coated with a photosensitive agent, using the above-mentioned exposure apparatus, and a step of developing the wafer. The post-process includes an assembly step (dicing and bonding) and packaging step (encapsulation). A liquid crystal display device is manufactured by a step of forming a transparent electrode. The step of forming a transparent electrode includes a step of applying a photosensitive agent onto a glass substrate on which a transparent conductive film is deposited, a step of exposing the glass substrate, coated with the photosensitive agent, using the above-mentioned exposure apparatus, and a step of developing the glass substrate. The method of manufacturing a device according to this embodiment can manufacture a device with a quality higher than those of devices manufactured by the prior arts.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-107716, filed May 7, 2010, which is hereby incorporated by reference herein in its entirety.

What is claimed is:

1. An exposure apparatus which projects a pattern of a reticle onto a substrate via a projection optical system using slit-shaped light while scanning the reticle and the substrate, thereby exposing the substrate, the apparatus comprising:
a stage which holds the substrate;
a positioning mechanism which positions said stage in a first direction to scan the substrate and a second direction parallel to an optical axis of the projection optical system;
a measurement device which measures a level of the substrate that is a position of the substrate in the second direction at a plurality of measurement points located with spacings therebetween in the first direction; and
a controller,
wherein the plurality of measurement points include a first measurement point, and a second measurement point within a region in which the slit-shaped light is incident on the substrate,
the exposure apparatus is configured to measure the level of the substrate at the first measurement point using said measurement device, and scan the substrate while positioning said stage in the second direction using said positioning mechanism based on the level measured at the first measurement point, and
said controller
causes, before the substrate is exposed, said measurement device to measure the level of the substrate at a predetermined position on the substrate at the first measurement point while said stage accelerates, and measure the level of the substrate at the predetermined position at the second measurement point while said stage moves at a constant velocity,
calculates a difference between the measurement results of the level of the substrate at the predetermined position, which are obtained at the first measurement point and the second measurement point, respectively, to obtain the calculated difference as a correction value for a measurement error due to factors associated with acceleration of said stage, and
scans the substrate while controlling said positioning mechanism based on the level of the substrate measured at the first measurement point and the obtained correction value, when the substrate is exposed at a given position after the level of the substrate at the given position is measured at the first measurement point while said stage accelerates, and scans the substrate while controlling said positioning mechanism based on the level of the substrate measured at the first measurement point, when the substrate is exposed after the level of the substrate at the given position is measured at the first measurement point while said stage moves at a constant velocity.

2. The apparatus according to claim 1, wherein before exposure processing of a lot, said controller obtains a correction value for a measurement error due to factors associated with acceleration of said stage using at least one substrate belonging to the lot, and scans substrates belonging to the lot using the obtained correction value.

3. An exposure method of projecting a pattern of a reticle onto a substrate via a projection optical system using slit-shaped light while scanning the reticle and the substrate in a first direction, thereby exposing the substrate, the method comprising the steps of:
measuring a level of the substrate that is a position of the substrate in a second direction parallel to an optical axis of the projection optical system at a predetermined position on the substrate while a stage which holds the substrate accelerates, at a first measurement point among a plurality of measurement points located with spacings therebetween in the first direction for a measurement device, and measuring the level of the substrate at the predetermined position while the stage moves at a constant velocity, at a second measurement point within a region in which the slit-shaped light is incident on the substrate;
calculating a difference between the measurement results of the level of the substrate at the predetermined position, which are obtained at the first measurement point and the second measurement point, respectively, to obtain the calculated difference as a correction value for a measurement error due to factors associated with acceleration of the stage; and
measuring the level of the substrate at the first measurement point using the measurement device, and scanning the substrate while positioning the stage in the second direction based on the level measured at the first measurement point,
wherein when the substrate is exposed at a given position on the substrate after the level of the substrate at the given position is measured at the first measurement point while the stage accelerates, the substrate is scanned while positioning the stage based on the level of the substrate measured at the first measurement point and the obtained value, and, when the substrate is exposed at a given position on the substrate after the level of the substrate at the given position is measured at the first measurement point while the stage moves at a constant velocity, the substrate is scanned while positioning the stage based on the level of the substrate measured at the first measurement point.

4. A method of manufacturing a device, the method comprising:
exposing a substrate using an exposure apparatus which projects a pattern of a reticle onto a substrate via a projection optical system using slit-shaped light while scanning the reticle and the substrate, thereby exposing the substrate;
developing the exposed substrate; and
processing the developed substrate to manufacture the device,
wherein the exposure apparatus comprises
a stage which holds the substrate,
a positioning mechanism which positions the stage in a first direction to scan the substrate and a second direction parallel to an optical axis of the projection optical system, a measurement device which measures a level of the substrate that is a position of the substrate in the second direction at a plurality of measurement points located with spacings therebetween in the first direction, and a controller, the plurality of measurement points include a first measurement point, and a second measurement point within a region in which the slit-shaped light is incident on the substrate, the exposure apparatus is configured to measure the level of the substrate at the first measurement point using the measurement device, and scan the substrate while positioning the stage in the second direction using the positioning mechanism based on the level measured at the first measurement point, and the controller causes, before the substrate is exposed, the measurement device to measure the level of the substrate at a predetermined position on the substrate at the first measurement point while the stage accelerates, and measure the level of the substrate at the predetermined position at the second measurement point while the stage moves at a constant velocity, calculates a difference between the measurement results of the level of the substrate at the predetermined position, which are obtained at the first measurement point and the second measurement point, respectively, to obtain the calculated difference as a correction value for a measurement error due to factors associated with acceleration of the stage, and scans the substrate while controlling the positioning mechanism based on the level of the substrate the first measurement point and the obtained correction value, when the substrate is exposed at the given position after the level of the substrate at the given position is measured at the first measurement point while the stage accelerates, and scans the substrate while controlling the positioning mechanism based on the level of the substrate measured at the first measurement point without using, when the substrate is exposed after the level of the substrate at the given position is measured at the first measurement point while the stage moves at a constant velocity.

5. An exposure apparatus which projects a pattern of a reticle onto a substrate via a projection optical system using slit-shaped light while scanning the reticle and the substrate, thereby exposing the substrate, the apparatus comprising:

a stage which holds the substrate;

a positioning mechanism which positions said stage in a first direction to scan the substrate and a second direction parallel to an optical axis of the projection optical system;

a measurement device which measures a level of the substrate that is a position of the substrate in the second direction at a plurality of measurement points located with spacings therebetween in the first direction; and a controller, wherein the plurality of measurement points include a first measurement point, and a second measurement point within a region in which the slit-shaped light is incident on the substrate, the exposure apparatus is configured to measure the level of the substrate at the first measurement point using said measurement device, and scan the substrate while positioning said stage in the second direction using said positioning mechanism based on the level measured at the first measurement point, and said controller causes, before the substrate is exposed, said measurement device to measure the level of the substrate at a predetermined position on the substrate at the first measurement point while said stage accelerates, and measure the level of the substrate at the predetermined position at the second measurement point while said stage moves at a constant velocity, calculates a difference between the measurement results of the level of the substrate at the predetermined position, which are obtained at the first measurement point and the second measurement point, respectively, to obtain the calculated difference as a correction value for a measurement error due to factors associated with acceleration of said stage, and scans the substrate while controlling said positioning mechanism based on the level of the substrate measured at the first measurement point and the obtained correction value so that the level of the substrate at the given position comes close to an exposure image plane position, when the substrate is exposed at the given position after the level of the substrate at the given position is measured at the first measurement point while said stage accelerates, and scans the substrate while controlling said positioning mechanism based on the level of the substrate measured at the first measurement point without using the obtained correction value so that the level of the substrate at the given position comes close to an exposure image plane position, when the substrate is exposed after the level of the substrate at the given position is measured at the first measurement point while said stage moves at a constant velocity.

6. An exposure apparatus which projects a pattern of a reticle onto a substrate via a projection optical system using slit-shaped light while scanning the reticle and the substrate, thereby exposing the substrate, the apparatus comprising:

a stage which holds the substrate;

a positioning mechanism which positions said stage in a first direction to scan the substrate and a second direction parallel to an optical axis of the projection optical system;

a measurement device which measures a level of the substrate that is a position of the substrate in the second direction at a plurality of measurement points located with spacings therebetween in the first direction; and a controller, wherein the plurality of measurement points include a first measurement point at which the level of the substrate can be measured earliest, and a second measurement point within a region in which the slit-shaped light is incident on the substrate, the exposure apparatus is configured to measure the level of the substrate at the first measurement point using said measurement device, and scan the substrate while positioning said stage in the second direction using said positioning mechanism based on the level measured at the first measurement point, and said controller causes, before the substrate is exposed, said measurement device to measure the level of the substrate at a predetermined position on the substrate at the first measurement point while said stage accelerates, and measure the level of the substrate at the predetermined position at the second measurement point while said stage moves at a constant velocity, calculates a difference between the measurement results of the level of the substrate at the predetermined position, which are obtained at the first measurement point and the second measurement point, respectively, to obtain the calculated difference as a correction value for a measurement error due to factors associated with acceleration of said stage, and scans the substrate while controlling said positioning mechanism based on the level of the substrate measured at the first measurement point and the obtained correction value, when the substrate is exposed at a given position after the level of the substrate at the given position is measured at the first measurement point while said stage accelerates, and scans the substrate while controlling said positioning mechanism based on the level of the substrate measured at the first measurement point, when the substrate is exposed after the level of the substrate at the given position is measured at the first measurement point while said stage moves at a constant velocity.

\* \* \* \* \*